United States Patent
Chisaka

(10) Patent No.: US 8,287,992 B2
(45) Date of Patent: *Oct. 16, 2012

(54) FLEXIBLE BOARD

(75) Inventor: Shunsuke Chisaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/227,525

(22) Filed: Sep. 8, 2011

(65) Prior Publication Data

US 2012/0003499 A1 Jan. 5, 2012

Related U.S. Application Data

(63) Continuation of application No. PCT/JP2010/053118, filed on Feb. 26, 2010.

(30) Foreign Application Priority Data

Mar. 9, 2009 (JP) ................................ 2009-054877

(51) Int. Cl.
*B32B 3/00* (2006.01)

(52) U.S. Cl. ........ 428/209; 174/254; 174/257; 174/258; 257/762; 257/766; 361/749; 361/751

(58) Field of Classification Search .................. 428/209; 174/257, 258, 260, 254; 257/762, 766; 361/749, 361/751

See application file for complete search history.

(56) References Cited

U.S. PATENT DOCUMENTS

| | | | | |
|---|---|---|---|---|
| 4,081,601 A | * | 3/1978 | Dinella et al. ................ | 174/257 |
| 4,572,925 A | * | 2/1986 | Scarlett ......................... | 174/257 |
| 5,017,271 A | * | 5/1991 | Whewell et al. ............... | 205/125 |
| 6,258,449 B1 | * | 7/2001 | Nagasawa et al. ............. | 428/209 |
| 6,331,347 B2 | * | 12/2001 | Haji ............................... | 428/209 |
| 6,426,143 B1 | * | 7/2002 | Voss et al. ..................... | 428/378 |
| 2010/0309641 A1 | | 12/2010 | Hata et al. | |

FOREIGN PATENT DOCUMENTS

| | | |
|---|---|---|
| JP | 07-245460 A | 9/1995 |
| JP | 09-199816 A | 7/1997 |
| JP | 10-032378 A | 2/1998 |
| JP | 2003-258397 A | 9/2003 |
| JP | 2006-344920 A | 12/2006 |
| JP | 2007-194265 A | 8/2007 |
| JP | 2008-243853 A | 10/2008 |
| WO | 2006/095990 A1 | 9/2006 |

OTHER PUBLICATIONS

Official Communication issued in International Patent Application No. PCT/JP2010/053118, mailed on Apr. 13, 2010.

Chisaka, "Resin Circuit Board", U.S. Appl. No. 13/227,523, filed Sep. 8, 2011.

* cited by examiner

*Primary Examiner* — Cathy Lam

(74) *Attorney, Agent, or Firm* — Keating & Bennett, LLP

(57) ABSTRACT

A reliable flexible board prevents disconnection from occurring in a conductor layer in a stacking process or during use of a product that repeatedly causes deformation. The flexible board includes resin layers and conductor layers that are alternately stacked on top of one another, wherein each of the conductor layers includes a first conductor layer made of a first metal and a second conductor layer made of a second metal disposed between one of the resin layers and the first conductor layer, the second metal having a higher ductility than the first metal.

8 Claims, 4 Drawing Sheets

FIG. 2A
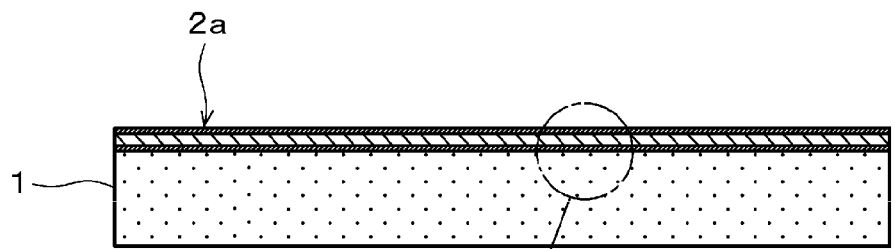
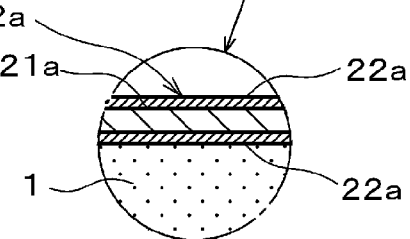
FIG. 2B
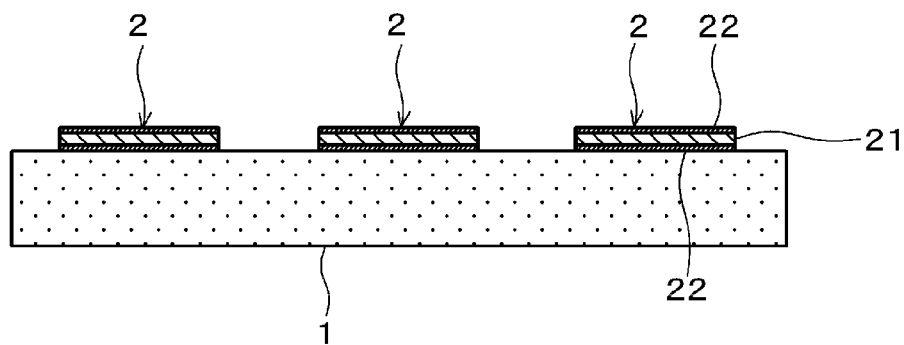
FIG. 2C
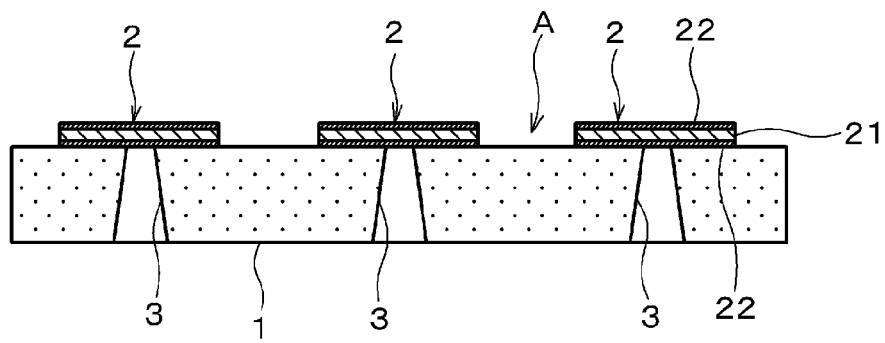

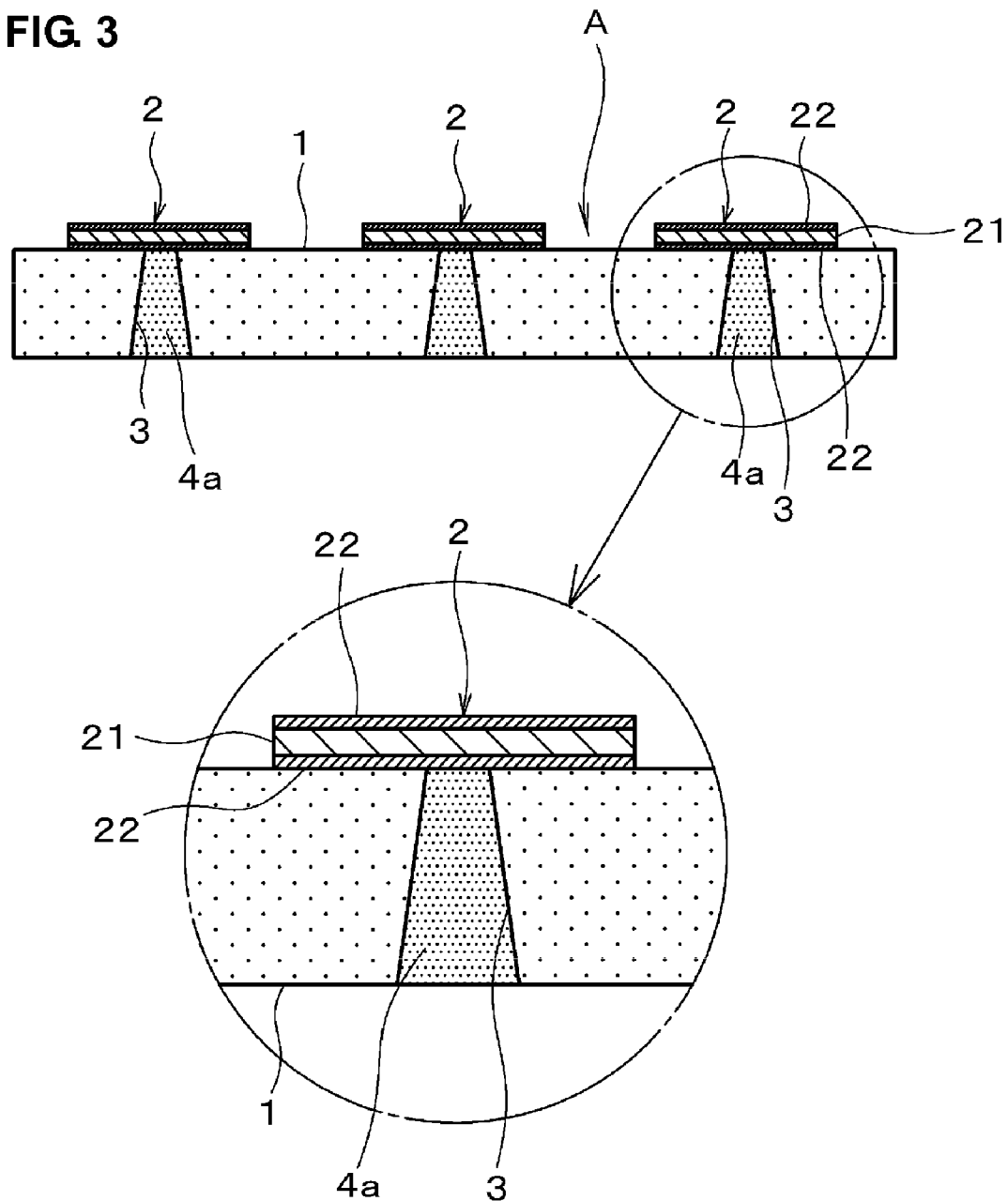

FLEXIBLE BOARD

BACKGROUND OF THE INVENTION

1. Field of the Invention

The present invention relates to a multilayer board and, more particularly, to a flexible multilayer board.

2. Description of the Related Art

Because of their utility in limited spaces, flexible boards have been widely used in electronic devices, such as cameras, mobile phones, personal computers, printers, and hard disk drives. With the reduction in size of electronic devices, flexible boards are becoming smaller, higher in density, and more multilayered.

One such flexible board is a flexible board (flexible print circuit board) that includes thermoplastic polyimide films and copper foil (conductor layers) alternately stacked on top of one another (see, for example, paragraph [0014] in Japanese Unexamined Patent Application Publication No. 7-245460).

As described above, flexible boards are suitably packaged in limited spaces and can be bent many times. Thus, flexible boards are suitably used in electronic devices that will inevitably be deformed during use.

As flexible boards become smaller and higher density, and as conductor layers (such as internal conductor patterns) become thinner, the likelihood of a disconnection occurring in a conductor layer, such as an internal conductor pattern, increases under repeated stress due to deformation, such as bending.

In the manufacture of a flexible board by stacking and pressing thermoplastic resin layers and conductor layers, such as internal conductor patterns, variations in the density of an internal conductor pattern cause variations in pressing force during the multilayering process, and a portion of the conductor layers, such as internal conductor patterns, that is subjected to increased force is often disconnected.

Thus, there is a demand for a reliable flexible board in which disconnection does not occur in a conductor layer, such as an internal conductor pattern, in a stacking and pressing process or in use of a product that repeatedly causes deformation of the flexible board.

A flexible board described in Japanese Unexamined Patent Application Publication No. 7-245460 is, for example, drawn at a predetermined temperature (for example, 300° C.) to form a flexible printed circuit board having a desired shape (see paragraph [0015] in Japanese Unexamined Patent Application Publication No. 7-245460) and cannot be used in applications that repeatedly cause deformation of the flexible board.

SUMMARY OF THE INVENTION

To overcome the problems described above preferred embodiments of the present invention provide a reliable flexible board that can be manufactured with high productivity and in which disconnection does not occur in a conductor layer, such as an internal conductor pattern, in a stacking and pressing process or in use of a product that repeatedly causes deformation of the flexible board.

A flexible board according to a preferred embodiment of the present invention preferably includes resin layers and conductor layers alternately stacked on top of one another, wherein each of the conductor layers includes a first conductor layer made of a first metal and a second conductor layer made of a second metal disposed between one of the resin layers and the first conductor layer, the second metal having a greater ductility than the first metal.

The second metal preferably retards or prevents the grain growth of the first metal.

The second conductor layer is preferably in contact with the corresponding resin layer. The second conductor layer is preferably in contact with the first conductor layer.

The second conductor layer is preferably disposed over substantially an entire interface between the corresponding conductor layer and the corresponding resin layer.

Preferably at least a portion of the second conductor layer includes an alloy of the first metal and the second metal.

The alloy may preferably be formed during a process of stacking the conductor layers and the resin layers.

The first metal of the first conductor layer is preferably primarily composed of Cu, for example.

The second metal of the second conductor layer is preferably primarily composed of Co and/or Ni, for example.

The resin layers are preferably made of a thermoplastic resin.

A flexible board according to a preferred embodiment of the present invention preferably includes resin layers and conductor layers alternately stacked on top of one another, wherein each of the conductor layers includes a first conductor layer made of a first metal and a second conductor layer made of a second metal disposed between one of the resin layers and the first conductor layer, the second metal having a greater ductility than the first metal. Upon bending, the second conductor layer made of the ductile metal effectively absorbs and relieves stress on the conductor layer.

A portion of the second metal of the second conductor layer preferably enters a grain boundary of the first metal of the first conductor layer and partially diffuses into crystal grains of the first metal. The metal of the second conductor layer entering the grain boundary of the first metal of the first conductor layer functions to retard the grain growth of the metal of the first conductor layer. An alloy (layer) of the first metal and the second metal diffusing into the crystal grain of the first metal functions to improve the ductility of the first conductor layer.

These functions effectively prevent disconnection in the conductor layer, such as an internal conductor pattern, in a stacking and pressing process and during use of a product that repeatedly causes deformation of the flexible board and provide a reliable flexible board that can be manufactured with high productivity.

Another preferred embodiment of the present invention can be suitably applied to a flexible portion of a rigid flexible board that includes a rigid portion made of a rigid material, such as glass epoxy, for example, and the flexible portion capable of integration or repeated bending.

When the second metal of the second conductor layer retards the grain growth of the first metal of the first conductor layer, the crystal grains of the first metal can be maintained in a fine and dense state. This ensures resistance to deformation (disconnection), which improves the practicality of preferred embodiments of the present invention.

When the first metal of the first conductor layer is Cu, examples of the metal that can retard the grain growth of the first metal include Co and Ni.

In a flexible board according to a preferred embodiment of the present invention, a thin third conductor layer may preferably be disposed between the second conductor layer and the resin layer to control characteristics. However, the second conductor layer in contact with the resin layer can more properly induce stress relaxation due to the high ductility of the second conductor layer.

The second conductor layer in contact with the first conductor layer also allows the ductile metal of the second conductor layer to be present in a grain boundary of metal grains of the first conductor layer, thereby inducing stress relaxation and increasing the resistance to deformation of the conductor layer. Furthermore, the second conductor layer in contact with the first conductor layer allows the ductile metal of the second conductor layer to diffuse into metal grains of the first conductor layer and prevent a reduction in the ductility of the first conductor layer, thereby increasing the resistance to deformation of the entire conductor layer.

The metal of the first conductor layer can diffuse into the metal of the second conductor layer to form an alloy (layer). This alloy (layer) functions to improve the ductility of the conductor layer, thereby increasing the resistance to deformation of the conductor layer.

The second conductor layer primarily composed of a metal having high ductility disposed over substantially the entire interface between the conductor layer and the resin layer can more effectively induce stress relaxation, making preferred embodiments of the present invention more effective.

When at least a portion of the second conductor layer includes an alloy of the first metal and the second metal, the ductility of the conductor layer can be gradually altered from the second conductor layer to the first conductor layer, which enhances stress relaxation.

The second conductor layer including an alloy of the first metal and the second metal can be formed under controlled pressure, temperature, and other conditions in a process of stacking and pressing conductor layers and resin layers.

The alloy of the metal of the first conductor layer and the metal of the second conductor layer can be formed with high productivity without using any complicated process.

It is preferable to use Cu, for example, in the first conductor layer in terms of electrical characteristics. In a case in which the conductor layer includes a monolayer structure primarily composed of Cu, a disconnection in the conductor layer may occur in the stacking and pressing process or during use of a product that repeatedly causes deformation. With a structure including a ductile second conductor layer as in preferred embodiments of the present invention, the second conductor layer effectively absorbs and relieves stress on the conductor layer, so as to provide a reliable flexible board.

When the conductor layer is primarily composed of Cu and the second metal of the second conductor layer is primarily composed of Co and/or Ni, for example, the flexible board prevents disconnection from occurring in the conductor layer in the manufacturing process or during use of the product and is highly reliable, because Co and Ni have high ductility and function to absorb and relieve stress on the conductor layer.

When the metal of the first conductor layer is Cu and that the second metal of the second conductor layer is primarily composed of Co and/or Ni, for example, the ductile Co and/or Ni can be present in a grain boundary of Cu grains of the first conductor layer to increase the resistance to deformation of the conductor layer, or the ductile Co and/or Ni is allowed to diffuse into Cu grains of the first conductor layer, so as to improve the ductility of the first conductor layer. This provides a reliable flexible board having high resistance to deformation of the entire conductor layer.

The alloying of Cu of the first conductor layer with Co and/or Ni of the second conductor layer ensures the bonding therebetween and consequently further improves the resistance to disconnection in the conductor layer.

The use of resin layers made of a thermoplastic resin under controlled conditions (such as temperature and pressing pressure) in the stacking process enables efficient manufacture of a flexible board having a layered structure.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A, 2B, and 2C are schematic explanatory views of a method for manufacturing the flexible multilayer board illustrated in FIGS. 1A and 1B.

FIG. 3 is a schematic explanatory view of a method for manufacturing the flexible multilayer board illustrated in FIG. 1, illustrating a process following the process illustrated in FIG. 2C.

DETAILED DESCRIPTION OF THE PREFERRED EMBODIMENTS

Figure 1A:
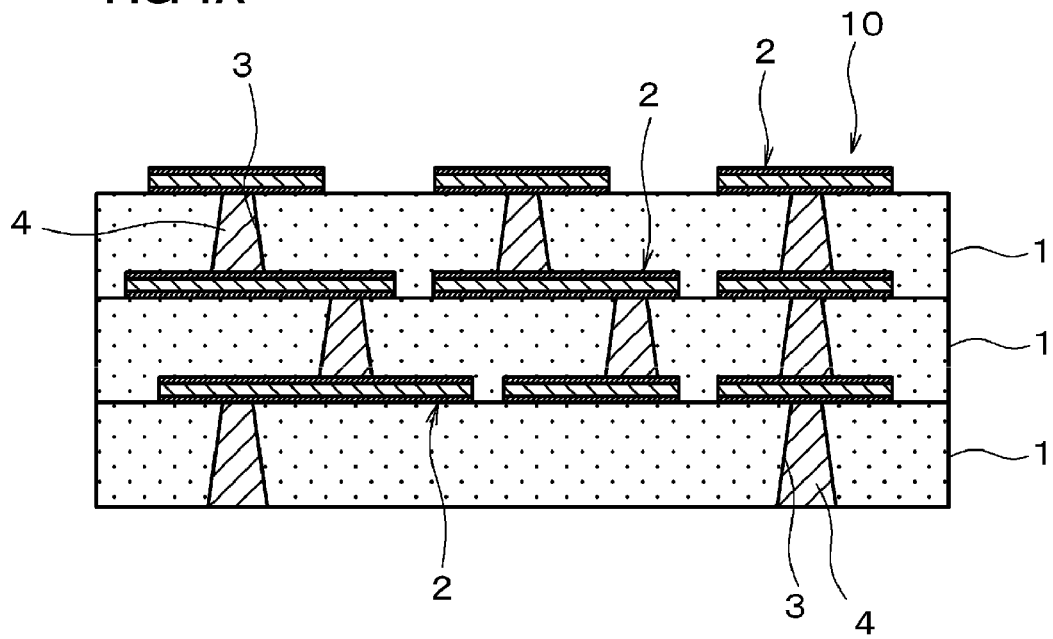
FIG. 1A is a schematic view of a flexible board according to a preferred embodiment of the present invention.

Preferred embodiments of the present invention will be described with reference to the drawing.

First Preferred Embodiment

Figure 1B:
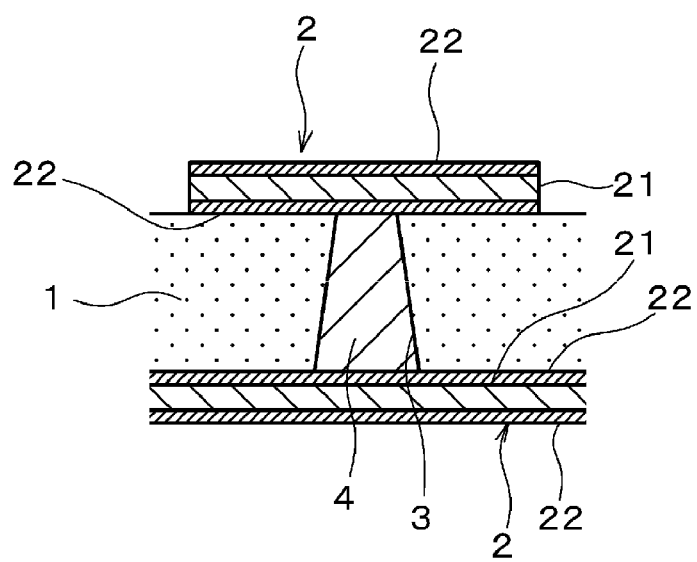
FIG. 1B is an enlarged view of a principal portion thereof.

FIGS. 1A and 1B schematically illustrate a flexible board according to a preferred embodiment of the present invention. FIG. 1A is a front cross-sectional view, and FIG. 1B is an enlarged cross-sectional view of a principal portion thereof.

As illustrated in FIGS. 1A and 1B, a flexible multilayer board 10 includes a resin layer 1 preferbly made of a thermoplastic resin, a conductor layer 2 having a predetermined pattern disposed on the thermoplastic resin layer 1, and a via-hole conductor 4 in a through-hole 3 disposed in the thermoplastic resin layer 1. The via-hole conductor 4 connects the conductor layers 2. The resin layer 1, the conductor layer 2, and the via-hole conductor 4 define a substrate layer.

In the flexible multilayer board 10, the thermoplastic resin layer 1 is preferably made of a thermoplastic resin having a melting point of at least about 250° C., such as a liquid crystal polymer (LCP) or polyetheretherketone (PEEK), for example.

The flexibility of the thermoplastic resin layer 1 is preferably controlled by the thickness and the degree of polymerization.

The resin of the resin layer 1 is not necessarily a thermoplastic resin and may be a thermosetting resin, for example.

The conductor layer 2 preferably includes a first conductor layer 21 and second conductor layers 22. The first conductor layer 21 is preferably primarily composed of Cu, for example, which is a first metal in a preferred embodiment of the present invention. The second conductor layers 22 are disposed over substantially the entire surfaces on the front and back sides of the first conductor layer 21. The second conductor layer 22 is preferably primarily composed of Ni, for example (a second metal in a preferred embodiment of the present invention), which has a higher ductility than Cu of the first conductor layer 21. The conductor layer 2 is disposed on the resin layer 1 such that each of the second conductor layers 22 is in contact with the corresponding resin layer 1.

In the flexible multilayer board 10, at least a portion of the second conductor layer 22 is preferably a Ni—Cu alloy, for example, that improves the ductility of the first conductor layer 21. The Ni—Cu alloy is formed by the diffusion of Cu of the first conductor layer 21 into Ni of the second conductor layer 22.

A portion of Ni of the second conductor layer 22 enters a grain boundary of Cu grains of the first conductor layer 21. Ni in the grain boundary of Cu grains retards the grain growth of Cu of the first conductor layer and thereby improves the resistance to cracking of the first conductor layer 21.

The via-hole conductor 4 is preferably formed by solidifying an electroconductive paste primarily composed of Ag in the through-hole 3.

As described above, the flexible multilayer board 10 includes the thermoplastic resin layers 1 and the conductor layers 2 alternately stacked on top of one another. Each of the conductor layers 2 preferably includes the first conductor layer 21 primarily composed of the first metal Cu, for example, and the second conductor layers 22 primarily composed of the second metal Ni, for example, having a higher ductility than Cu of the first conductor layer 21. The first conductor layer 21 of the conductor layer 2 is attached to the thermoplastic resin layer 1 through the second conductor layer 22 having higher ductility than Cu of the first conductor layer 21. Thus, upon bending of the thermoplastic resin layer 1, the ductile second conductor layer 22 functions to absorb and relieve stress on the conductor layer 2.

A portion of Ni of the second conductor layer 22 enters a grain boundary of Cu of the first conductor layer 21 and partially diffuses into crystal grains of Cu. Ni in the grain boundary of Cu of the first conductor layer 21 retards and prevents the grain growth of Cu of the first conductor layer 21. Ni in Cu crystal grains can form an alloy with Cu. This alloy functions to improve the ductility of the first conductor layer 21.

Cu of the first conductor layer 21 diffuses into Ni of the second conductor layer 22 to form an alloy. This alloy also functions to improve the ductility and the resistance to deformation of the conductor layer 2.

These functions provide a reliable flexible multilayer board 10 that prevents disconnection from occurring in the conductor layer 2 in a multilayering process of stacking and pressing or during use of the product that repeatedly causes deformation.

A method for manufacturing the flexible multilayer board 10 will be described below.

As illustrated in FIG. 2A, before patterning, a conductor layer (metallic foil) 2a is attached to an insulating layer 1 preferably made of a thermoplastic resin having a melting point of at least about 250° C., such as liquid crystal polymer (LCP) or polyetheretherketone (PEEK), for example. The conductor layer 2a preferably includes Cu foil 21a (a metal layer for a first conductor layer 21) and covering layers 22a (metal layers for second conductor layers 22) plated over the entire surface on the front and back sides of the Cu foil 21a, for example. The covering layers 22a are preferably made of Ni, which has a higher ductility than Cu. The metal layers 22a for the second conductor layers may also be formed by a thin film forming method other than plating, such as sputtering.

As illustrated in FIG. 2B, the metallic foil 2a on the thermoplastic resin layer 1 is etched to form a conductor layer 2 having a desired pattern.

For example, the conductor layer 2 may preferably be formed, for example, by forming a predetermined resist pattern on the metallic foil 2a, etching the metallic foil 2a with an etchant, and removing the resist pattern.

Alternatively, a patterned metallic foil may be attached to the thermoplastic resin layer 1.

As illustrated in FIG. 2C, a through-hole 3 is formed at a predetermined position in the thermoplastic resin layer 1 preferably by laser processing, for example. A surface of the thermoplastic resin layer 1 on which no conductor layer 2 is disposed is irradiated with a laser beam to form the through-hole 3 that extends to the back side of the conductor layer 2. In the resulting substrate layer A, the patterned conductor layer 2 is formed on the thermoplastic resin layer 1 having the through-hole 3 such that a portion of the patterned conductor layer 2 covers the through-hole 3.

The procedures for forming the substrate layer A illustrated in FIG. 2C are not limited to those described above. For example, after the through-hole 3 has been formed in the thermoplastic resin layer 1, the conductor layer 2 may be formed by etching or by another process.

As illustrated in FIG. 3, the through-hole 3 in the thermoplastic resin layer 1 (substrate layer A) is filled with an electroconductive paste 4a preferably primarily composed of Ag grains, for example.

Figure 4:
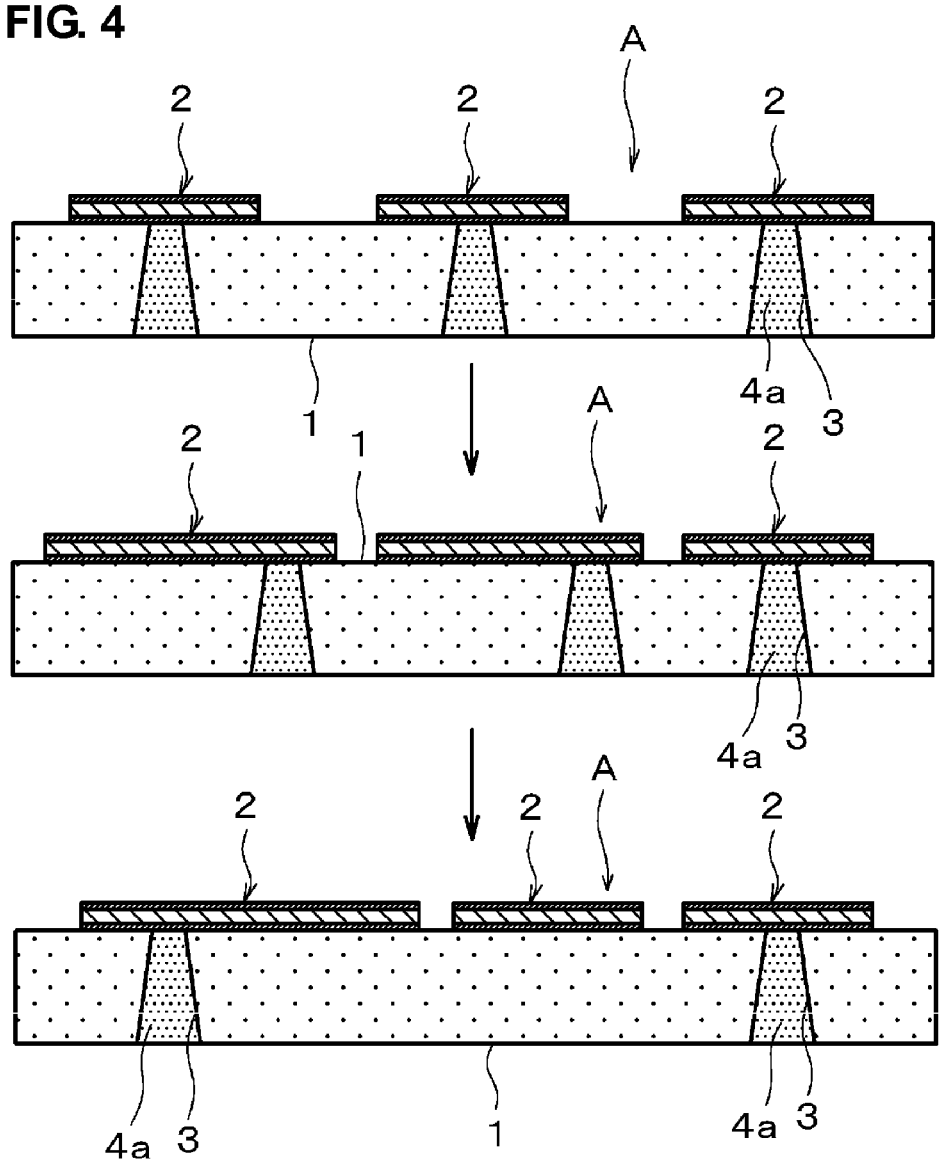
FIG. 4 is a schematic explanatory view of a method for manufacturing the flexible multilayer board illustrated in FIGS. 1A and 1B, illustrating a process following the process illustrated in FIG. 3.

As illustrated in FIG. 4, the thermoplastic resin layers 1 (substrate layers A) are stacked in a predetermined order and are pressed under a vacuum at a temperature at which the thermoplastic resin layers 1 exhibit plasticity but do not melt, for example, about 250° C. to about 350° C.

In FIG. 4, the top layer is the thermoplastic resin layer (substrate layer) A illustrated in FIG. 3. The second and third substrate layers from the top are thermoplastic resin layers (substrate layers) A in which the shape of the conductor layer 2 and the positions of the through-holes 3 are different from those of the top layer.

Through the stacking and pressing process, the via-hole conductors 4 are connected to the conductor layers 2, and the thermoplastic resin layers 1 are pressed and laminated into one piece.

In the stacking and pressing process, Ni of the second conductor layer 22 enters a grain boundary of Cu grains of the first conductor layer 21 and partially diffuses into the Cu grains.

Ni in the grain boundary of Cu grains retards and prevents the grain growth of the Cu grains. An alloy layer formed by the diffusion of Ni in the Cu grains functions to improve the ductility of the first conductor layer.

Cu of the first conductor layer 21 can also diffuse into Ni of the second conductor layer 22. At least a portion of the second conductor layer 22 forms an alloy of Ni and Cu. This alloy also functions to improve the ductility and the resistance to deformation of the conductor layer 2.

These functions effectively provide a reliable flexible multilayer board 10 that can be manufactured with high productivity and that prevents disconnection from occurring in the conductor layer 2 in a multilayering process of stacking and pressing or during use of the product that repeatedly causes deformation.

In the present preferred embodiment, the metal layer 21a for the first conductor layer 21 is preferably a Cu layer (Cu foil), and the metal layers 22a for the second conductor layers 22 are preferably Ni layers, for example. Alternatively, the metal layer 21a for the first conductor layer may be made of a conductive material other than Cu. The metal layers 22a for the second conductor layers may also be made of a conductive material other than Ni, for example, Co or Co and Ni.

It is preferable that the metal layer 21a for the first conductor layer be Cu from the standpoint of the characteristics of the conductor layer. It is preferable that the metal layer 21a made of Cu be combined with the metal layer 22a made of Co, Ni, or Co and Ni, for example.

Also in the case of the metal layer made of Cu for the first conductor layer that is combined with the metal layer made of Co or Co and Ni for a second conductor layer, it has been confirmed that a reliable flexible multilayer board can be obtained that can be manufactured with high productivity and that prevents disconnection from occurring in a conductor layer (such as an internal conductor pattern) in a multilayering process of stacking and pressing or during use of a product that repeatedly causes deformation.

In the flexible multilayer board 10 according to the preferred embodiments described above, since the first conductor layer 21 is covered with the second conductor layer 22, the surface of the first conductor layer 21 is protected from oxidation. This obviates the necessity of a plating process for preventing the oxidation after the stacking process.

Although not shown in the present preferred embodiment, preferred embodiments of the present invention can be suitably applied to a rigid flexible board that includes a rigid portion made of a rigid material, such as glass epoxy, for example, and a flexible portion capable of integration or repeated bending.

The present invention is not limited to the preferred embodiments described above. For example, the type of the material of the resin layer, the type of the material of the conductor layer, the specific pattern of the conductor layer, and the numbers of thermoplastic resin layers and conductor layers alternately stacked on top of one another and their stacked form may be modified or altered without departing from the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A flexible board, comprising:
   a plurality of resin layers and a plurality of conductor layers alternately stacked on top of one another; wherein
   each of the plurality of conductor layers includes a first conductor layer made of a first metal primarily composed of copper and second conductor layers made of a second metal primarily composed of at least one of cobalt or nickel disposed between a corresponding one of the plurality of resin layers and the first conductor layer, such that the first conductor layer is disposed between two of the second conductor layers; and
   the second metal has a higher ductility than the first metal.

2. The flexible board according to claim 1, wherein the second metal retards grain growth of the first metal.

3. The flexible board according to claim 1, wherein at least one of the second conductor layers is in contact with a corresponding one of the plurality of resin layers.

4. The flexible board according to claim 1, wherein at least one of the second conductor layers is in contact with the first conductor layer.

5. The flexible board according to claim 1 wherein at least one of the second conductor layers is disposed over substantially an entire interface between the first conductor layer and a corresponding one of the plurality of resin layers.

6. The flexible board according to claim 1, wherein at least a portion of at least one of the second conductor layers includes an alloy of the first metal and the second metal.

7. The flexible board according to claim 6, wherein the alloy is formed during a process of stacking the plurality of conductor layers and the plurality of resin layers.

8. The flexible board according to claim 1, wherein the plurality of resin layers are made of a thermoplastic resin.

\* \* \* \* \*